Aug. 30, 1960 G. L. FREDENDALL 2,951,206

VARIABLE DELAY LINE

Filed Nov. 15, 1957 2 Sheets-Sheet 1

INVENTOR.
GORDON L. FREDENDALL
BY
Charles H. Brown
ATTORNEY

Aug. 30, 1960 G. L. FREDENDALL 2,951,206

VARIABLE DELAY LINE

Filed Nov. 15, 1957 2 Sheets-Sheet 2

INVENTOR.
GORDON L. FREDENDALL
BY
Charles H. Brown
ATTORNEY

United States Patent Office 2,951,206
Patented Aug. 30, 1960

2,951,206

VARIABLE DELAY LINE

Gordon L. Fredendall, Southampton, Pa., assignor to Radio Corporation of America, a corporation of Delaware Filed Nov. 15, 1957, Ser. No. 696,691

16 Claims. (Cl. 328—177)

Figures 1, 2:
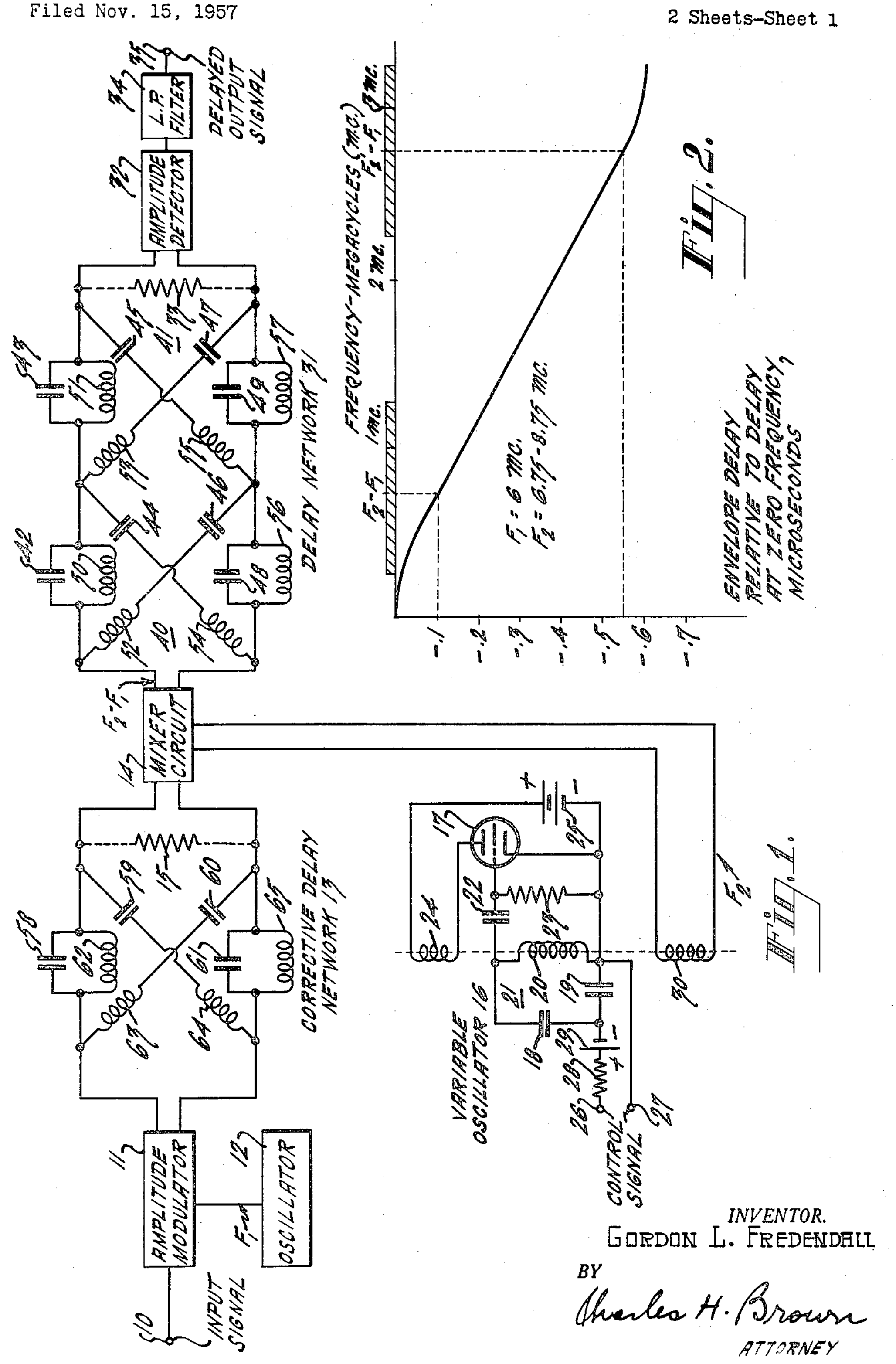

The invention relates to variable delay lines. Particularly, the invention relates to an electronically controlled variable delay line system capable of delaying an input signal of given frequency band width a desired amount without introducing objectionable distortions in the delayed signal.

It is an object of the invention to provide an improved electronically controlled variable delay line.

Another object is to provide a novel variable delay line capable of delaying in a desired amount an input signal having any one of a wide range of frequency band widths without introducing objectionable distortions in the delayed signal.

A further object is to provide a novel electronically controlled variable delay line capable of delaying in a desired amount an input signal of wide frequency band width, such as a television signal, without introducing objectional distortions in the delayed signal.

A still further object is to provide a controllable delay line useful in the magnetic recording of color pictures.

According to one embodiment of the invention, a signal to be delayed is applied as an input signal to an amplitude modulator to which a first signal of unvarying or fixed carrier frequency is also applied. The modulator functions to produce an output signal of the carrier frequency amplitude modulated according to the input signal. The modulated signal is applied from the modulator through a corrective delay network to a mixer circuit. A variable oscillator connected to the mixer circuit is arranged to apply a second signal to the mixer circuit of a frequency determined according to a given parameter of a control signal applied to the oscillator. The variable oscillator is arranged so that the signal produced by it varies in frequency according to the given parameter of the control signal over a range of frequencies which is, for example, higher than the unvarying carrier frequency.

The mixer circuit functions to produce a heterodyned or output signal which, in the example given, is of a carrier frequency equal to the frequency of the second signal less the unvarying carrier frequency. The resultant or heterodyned signal is applied from the mixer circuit to a second delay network characterized by a linear delay-frequency relation. For example, the second delay network may be constructed such that, as the frequency of the heterodyned signal increases, the delay provided by the second delay network decreases in a corresponding amount. As the frequency of the heterodyned signal decreases, the delay provided by the second delay network increases in a corresponding amount. The delayed heterodyned signal is applied from the second delay network to an output circuit. The output circuit includes suitable means for recovering or, in other words, detecting the envelope of the delayed heterodyned signal. By this action, a signal representative of the input signal to the variable delay line of the invention but delayed by an amount determined by the operation of the second delay network is made available in the output circuit of the variable delay line system for application to a utilization circuit.

Since the carrier frequency of the first signal applied to the amplitude modulator is unvarying, the frequency of the second signal applied to the mixer circuit from the variable oscillator determines the position of the carrier of the heterodyned signal on the delay characteristic curve of the second delay network. By varying the frequency of the signal applied to the mixer circuit from the variable oscillator according to the given parameter of the control signal applied to the variable oscillator, the delay imparted to the heterodyned signal and, therefore, the delay imparted to the input signal applied to the variable delay line of the invention is varied in a corresponding and desired amount.

If the input signal is of a wide frequency band width, such as a television signal, the variation in the delay over the frequency band width of the input signal after the input signal has been delayed by the second delay network may be excessive if no corrective measures are provided. If no correction is provided, the excessive delay over the band width may by the distortion created prevent the use of the delayed signal available at the output of the variabe delay line in the manner intended. A feature of the invention is the provision of the corrective delay network connected between the modulator and the mixer circuit. The corrective delay network is constructed so as to impart over the band width of the signal fed through the variable delay line system a delay equal in slope but opposite in direction to the delay imparted to the signal by the second delay network. In the example given, the corrective delay network is constructed to impart a delay to the heterodyned signal at the output of the mixer circuit which increases as the frequency of the heterodyned signal increases, and so on. A variation in the delay over the frequency band width of the input signal imparted by the second delay network is compensated so that the delay is substantially the same over the frequency band width of the signal representative of the input signal (but delayed a desired amount) available at the output of the variable delay line for application to a utilization circuit. An electronically controlled variable delay line is provided by the invention by which an input signal having either a narrow or relatively wide frequency band width can be delayed a desired amount without introducing objectional distortion in the delayed signal.

Figure 3:
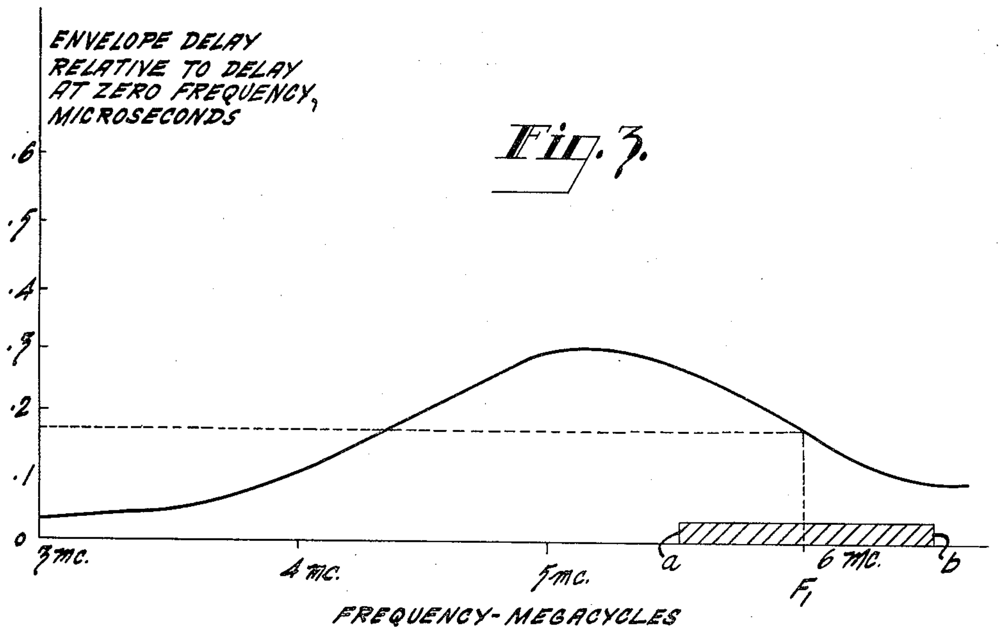
Figure 4:
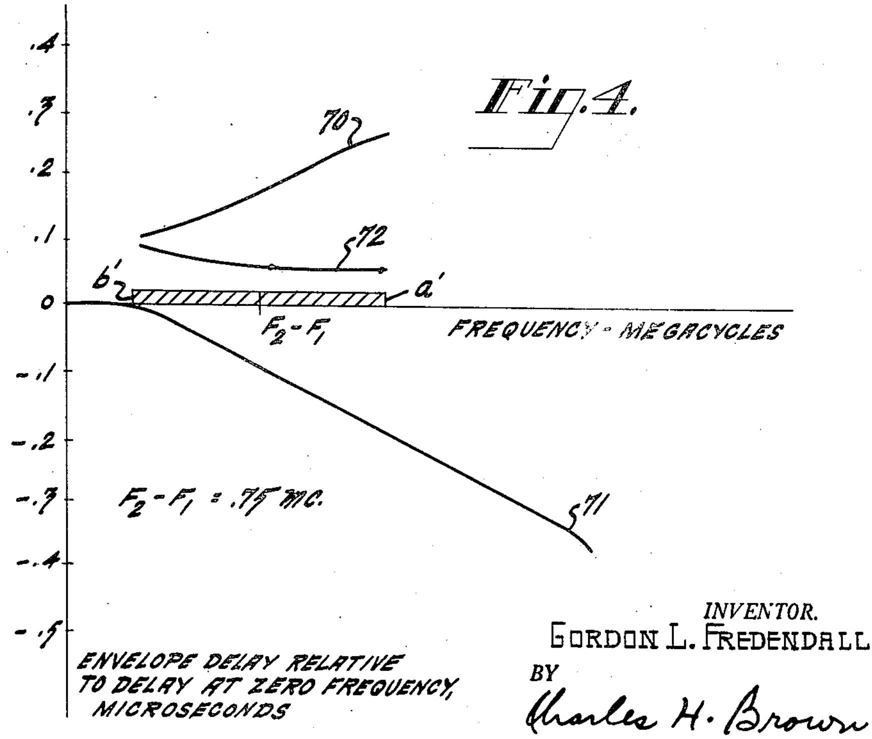

A more detailed description of the invention will now be given in connection with the accompanying drawing in which:

Figure 1 is a diagram of one embodiment of a variable delay line constructed according to the invention; and Figures 2, 3, and 4 show curves used in describing the operation of the embodiment of the invention given in Figure 1.

Referring to Figure 1, an input signal to be delayed is applied via an input terminal 10 to an amplitude modulator 11. The input signal may be of any type having a parameter which varies with time. The input signal may be in the form of a sine wave, square wave or may be in any one of a number of other known wave forms. In describing the operation of the embodiment of the invention given in Figure 1, it is assumed that the input signal is in the form of a sine wave. An oscillator 12 is connected to the modulator 11 and is arranged to supply a signal of unvarying carrier frequency $F_1$ to the modulator. The oscillator 12 may be of any known type designed to supply a signal of constant frequency. While oscillator 12 is defined as supplying a fixed or unvarying carrier frequency $F_1$, it is clear that the oscillator 12 may be arranged to selectively supply any one of a number of signals of different carrier frequencies $F_1$. For example, the oscillator 12 may be a crystal-controlled oscillator including means for regulating the temperature of the crystal to provide frequency stability.

The modulator 11 functions in a manner understood in the art to produce an output signal of the carrier frequency $F_1$ amplitude modulated according to the input signal. The modulator 11 may, for example, be arranged for grid-bias modulation or may include a multigrid vacuum tube such that the signal supplied by the oscillator 12 is applied to one grid and the input signal is applied to a second grid, and so on. The modulator 11 may be be constructed in the manner of any one of a number of different types of amplitude modulators known in the art. The modulated output signal is applied from the modulator 11 to a corrective delay network 13. The corrective delay network 13 includes a conventional all-pass inductance-capacitance filter which is characterized by a substantially linear delay-frequency relation during at least a portion of its delay characteristic curve. That is, as the frequency of the modulated output signal applied to the network 13 varies in a given direction, the delay imparted to the signal by the network 13 varies in a desired amount and direction. The amount and direction of the delay can be determined by choosing the proper values of the various inductors and capacitors in the network 13, following established known procedures.

The delayed output signal of the network 13 is applied to a mixer circuit 14. The input resistance of the mixer circuit 14 across which the output signal of the network 13 is fed is represented in Figure 1 as a dotted line resistor 15. A variable oscillator 16 is provided for supplying a signal of varying frequency $F_2$ to the mixer circuit 14. The oscillator 16 shown is sometimes referred to in the art as a tickler-feedback type of oscillator and includes a triode vacuum tube 17. The frequency-determining or tank circuit 21 of the oscillator 16 includes capacitors 18, 19 and an inductor 20. The tank circuit 21 is connected between the grid and cathode of the tube 17 over an electrical path including a grid biasing network comprising a capacitor 22 and resistor 23. The plate is connected to the cathode of tube 17 over an electrical path including a winding 24 inductively coupled to the inductor 20 and a source of unidirectional potential represented by a battery 25 poled in the direction shown. A control signal is applied via a pair of input terminals 26, 27 to the tank circuit 21 over an electrical path including a resistor 28 and a source of unidirectional bias potential represented by a battery 29 poled in the direction shown. The terminal 27 is connected to a point of reference potential such as ground, not shown.

As will be described, the oscillator 16 is arranged to produce a signal of a frequency $F_2$ which varies over a predetermined range of frequencies according to the voltage amplitude of the control signal applied to the tank circuit 21. In the embodiment of the invention to be described, the range of frequencies $F_2$ over which the oscillator 16 is variable is assumed to be higher than the carrier frequency $F_1$ of the signal applied to the mixer circuit 14 from the network 13. The oscillator 16 is connected to the mixer circuit 14 by means of a winding 30 inductively coupled to the inductor 20 of the tank circuit 21.

The mixer circuit 14 which may include a multigrid electron discharge vacuum tube or other known arrangement functions in a manner understood in the art to produce a heterodyned output signal having a frequency equal to the frequency $F_2$ of the signal supplied by the oscillator 16 less the frequency $F_1$ of the signal supplied to the mixer circuit 14 from the network 13. The resultant or heterodyned signal of a carrier frequency $F_2-F_1$ is fed from the mixer circuit 14 to a delay network 31. The delay network 31 includes a two-section 40, 41 all-pass inductance-capacitance filter, each section of which is similar to the filter included in the network 13. As in the case of the filter of the network 13, the filter of the network 31 is characterized by a linear delay-frequency relation during at least a portion of its delay characteristic curve. As the frequency $F_2-F_1$ of the heterodyned signal applied to the input of the network 31 varies, the delay imparted to the heterodyned signal varies in a desired amount and direction. The amount and direction of delay imparted to the heterodyned signal by the network 31 can be determined by choosing the values of the inductors and capacitors of the network 31, following the known procedures referred to in connection with the network 13.

The signal of frequency $F_2-F_1$ delayed according to the operation of the network 31 is applied to an amplitude detector 32. The input resistance of the detector 32 across which the output signal of the network 31 is applied is represented as a dotted line resistor 33. The detector 32 which may, for example, include a diode rectifier biased to conduct according to variations in amplitude functions to recover the envelope of the signal applied to the detector 32. A signal appears at the output of the detector 32 representative of the input signal to the variable delay line system but delayed an amount determined by the operation of the network 31. A low pass filter 34 may be connected to the output of the detector 32 to filter out any ripple voltage in the delayed output signal, resulting from the processing by the detector 32 of the signal fed through the variable delay line system. The filter 34 may include, for example, an inductance-capacitance arrangement. The use of such filter arrangements to perform the function described is understood in the art. A signal representative of the input signal but delayed a desired amount appears at an output terminal 35 connected to the output of the filter 34. The delayed signal is available at the output of the filter 34 for application via terminal 35 to a utilization circuit, not shown.

In describing the operation of the invention, reference will be made to the curves shown in Figures 2, 3 and 4. While specific frequencies and values of certain components are designated, the frequencies and values are given only by way of example and may be altered to meet the requirements of a particular application.

The input signal to be delayed is applied to the modulator 11 via terminal 10. The oscillator 12 is arranged to supply to the modulator 11 a signal of a carrier frequency $F_1$ higher than the frequency of the input signal such that the modulator 11 functions to produce an output signal of the carrier frequency $F_1$ amplitude modulated according to the input signal. The modulated output signal will have side-band components extending on each side of the carrier frequency $F_1$ depending upon the range of frequency components included in the input signal. The signal supplied by the oscillator 12 is assumed to have a frequency $F_1$ of 6 mcs. (megacycles). The modulated signal of a 6 mc. carrier frequency is applied from the modulator 11 through the corrective delay network 13 to the mixer circuit 14. The operation of the network 13 will be described following a description of the operation of the second delay network 31.

The variable oscillator 16 is arranged to supply to the mixer circuit 14 a signal of a frequency $F_2$ which varies over a given range of frequencies. The operation of a tickler-feedback oscillator such as that shown is known and need not be described in detail. The feedback voltage of the proper phase from the plate to the grid circuit of tube 17 is accomplished by mutual inductive coupling between the oscillator tank coil or inductor 20 and the tickler feedback coil or winding 24. The amount of feedback voltage is determined by the amount of flux from winding 24 that links inductor 20. The feedback can therefore be varied by moving the winding 24 with respect to the inductor 20. In the frequency-determining circuit 21, the inductor 20 and capacitor 18 interchange energy at the resonant frequency rate, and the excitation voltage developed across the capacitor 18 is applied to the grid of tube 17 through the grid-biasing network including capacitor 22 and resistor 23. The frequency of operation can be determined by varying the value of the capacitor 18 so as to alter the effective capacitance across the inductor 20.

The operation of the invention requires that the oscillator 16 be capable of producing a signal which varies in frequency $F_2$ over a relatively wide range of frequencies. For example, a ten volt change may occur across the capacitor 18 while the oscillator 16 may only be producing a signal of one-half volt. To accomplish this end, the capacitor 18 may be constructed in the form of a semiconductor diode. The use of a semiconductor diode as a variable reactance is known. The diode 18 is poled such that the cathode thereof is connected to the grid of tube 17 through the capacitor 22 and the anode of the diode is connected to the battery 29, the anode being biased positive with respect to the cathode for high conduction. The battery 29 is poled to supply a negative bias voltage to the anode of the diode 18, and the diode 18 is normally operated in its non-conducting region. As the amplitude of the control signal applied to the terminals 26, 27 varies, the voltage developed across the diode 18 varies in a similar manner. As the amplitude of the control signal increases, the anode is biased more positive and the diode 18 conducts more heavily. As the amplitude of the control signal decreases, the anode is biased more negative (less positive) and the diode 18 conducts less heavily, and so on.

The diode 18 acts as a variable reactance, since the resulting change in voltage developed across the diode 18 functions to change the rate at which energy is interchanged between the diode or capacitor 18 and the inductor 20. The frequency of the oscillator 16 is determined as a function of the amplitude of the control signal. The capacitor 19 functions as a D.C. (direct current) separation capacitor to prevent the flow of D.C. in the tank circuit 21. A germanium crystal diode identified as 1N34 may, for example, be used for the capacitor 18. The resulting signal of varying frequency $F_2$ is applied to the mixer circuit 14 by means of the winding 30.

As will become apparent, two considerations are involved in determining the actual range of frequencies supplied by the oscillator 16. First, the range of frequencies must be sufficient to afford the desired variation in the amount of delay imparted to the input signal. Secondly, the range of frequencies must be such that the lowest possible frequency $F_2-F_1$ of the signal appearing at the output of the mixer circuit 14 permits the signal of frequency $F_2-F_1$ plus sidebands to be applied to the network 31. If the frequency $F_2-F_1$ should be too low, the lower sidebands of the signal of frequency $F_2-F_1$ will pass through zero frequency. It will be assumed that the oscillator 16 is constructed to produce a signal having a frequency range of 6.75 mc. to 8.75 mc.

Referring to the curve shown in Figure 2, the mixer circuit 14 is operated in response to the signal of frequency $F_1$ and to the signal of frequency $F_2$ to produce a heterodyned signal of a carrier frequency $F_2-F_1$, which varies from 0.75 mc. to 2.75 mc. The heterodyned signal of frequency $F_2-F_1$ is applied from the mixer circuit 14 to the network 31. The network 31 is constructed of two all-pass filter sections 40, 41 connected in cascade. The particular filter sections shown are often referred to as being of a lattice construction. That is, each side of the filter section includes a parallel-tuned resonant circuit, a pair of series-tuned resonant circuits being cross-connected to the opposite ends of the parallel-tuned resonant circuits. Depending upon the values of the capacitors and inductors included in section, the signal energy passed by that section is delayed as a function of the frequency of the signal energy. As the frequency of the signal energy changes in a given direction, the values of the components included in the parallel-tuned resonant circuits are chosen so that the flow of signal energy through the parallel-tuned resonant circuits is impeded or decreases. The values of the components included in the series-tuned resonant circuits are chosen so that the flow of signal energy therethrough increases. As a result, a shift in the phase angle of the signal energy at the output of the filter section occurs of an increased amount determined by the change in frequency. When the frequency of the signal energy changes in the opposite direction, the flow of signal energy through the parallel-tuned resonant circuits increases and the flow of signal energy through the series-tuned resonant circuits decreases. A correspondingly smaller shift in the phase angle results, and so on. Ideally, such filters have zero attenuation for all frequencies from zero to infinity. In other words, the filter section alters the phase but not the amplitude of the signal energy supplied thereto. By properly determining the values of the components included in a filter section, a desired delay characteristic curve can be obtained for that filter section. A discussion of the construction and operation of such an all-pass filter can be found in "The Radio Engineers Handbook"—Terman, published by McGraw-Hill Book Company, 1943, pages 248–249, and in other publications. Because the input resistance of the all-pass filter section remains constant for all frequencies, any number of the filter sections can be connected in series or cascade in the manner shown in Figure 1.

In constructing the variable delay line of the invention, the values of the components included in the delay network 31 are chosen such that the network has a delay characteristic curve which is substantially linear over the range of frequencies $F_2-F_1$ or, in the example given, 0.75 mc. to 2.75 mc. In other words, the delay imparted to the signal fed through the network 31 should continue to vary in a given direction as the frequency $F_2-F_1$ changes in a given direction. For example, the various components included in the network 31 may have values as follows:

| | | |
|---|---|---|
| Capacitors **42, 43, 48, 49** | micromicrofarads | 0.75 |
| Capacitors **44, 46** | do | 0.3 |
| Capacitors **45, 47** | do | 0.0845 |
| Inductors **50, 56** | micromicrohenries | 0.3 |
| Inductors **52, 54** | do | 0.075 |
| Inductors **51, 57** | do | 0.0845 |
| Inductors **53, 55** | do | 0.075 |
| Resistor **33** | ohms | 1 |

Assuming the values given above, the first filter section 40 has a delay characteristic curve such that the amount of delay imparted to the signal fed therethrough tends to decrease as the frequency $F_2-F_1$ increases. The second filter section 41 has a delay characteristic curve such that the delay tends to increase as the frequency $F_2-F_1$ increases. By connecting the two filter sections 40, 41 in cascade, a composite delay characteristic curve for the network 31 is obtained. The resulting delay characteristic curve is given in Figure 2. The envelope delay relative to the delay at zero frequency versus frequency is plotted. As shown, the delay characteristic curve has a substantially linear delay-frequency relation over the range of frequencies 0.75–3.25 mc. As the frequency $F_2-F_1$ increases, the delay imparted by the network 31 decreases from a maximum amount. The delay decreases from a maximum at zero frequency to a lower amount as the frequency increases. The network 31 imparts a variation in delay of 0.45 microsecond as the frequency $F_2-F_1$ changes from one extreme to the other.

Since the frequency $F_1$ is fixed at 6 mc., it is evident that by varying the frequency $F_2$ between 6.75 and 8.75 mc. the amount of delay imparted to the signal of frequency $F_2-F_1$ can be varied in a corresponding amount, By varying the frequency $F_2$ of the signal supplied by the oscillator 16 according to the amplitude of the control signal applied to terminals 26 and 27, the amount of delay imparted to the signal fed through the network 31 can be delayed a desired amount. The amplitude of the control signal determines the delay given to the input signal passed through the variable delay line of the invention. The envelope of the delayed signal is recovered by the detector 32 and a signal representative of the input signal but delayed an amount according to the amplitude of the control signal is applied through the filter 34 for application to a utilization circuit via terminal 35.

Referring to Figure 2, the signal of frequency $F_2-F_1$ appearing at the output of the mixer circuit 14 is assumed to have a band width of 1 mc. In other words, the heterodyned signal is assumed to have a relatively wide band width. When the frequency $F_2$ is 6.75 mc. ($F_2-F_1$ equals .75 mc.), the delay imparted to the heterodyned signal by the network 31 is indicated as varying from .01 to .21 microsecond over the band width of the heterodyned signal. A similar variation in the delay over the frequency band width occurs for different frequencies $F_2-F_1$ in the range of .75 to 2.75 mc. Such a relatively large variation in delay over the frequency band width of the heterodyned signal can in various applications be undesirable in that the distortion introduced in the signal prevents the proper processing thereof in a desired manner. This is true for applications where the time relationship between the side band signals is critical, as in a television signal, and must be retained in the output signal of the variable delay line to permit the proper recovery of the information carried by the side bands.

A feature of the invention is the use of the delay network 13 to correct for a condition of excessive variation in delay over the band width of a signal fed through the variable delay line. Referring to Figure 1, the network 13 is an all-pass filter which is similar in construction and operation to the filter sections 40, 41 of the network 31. The various values of the components included in the network 13 are chosen so that the network 13 serves to impart a delay to the heterodyned signal available at the output of the mixer circuit 14 of the same slope but opposite in direction to the delay imparted to the heterodyned signal by the network 31. In the example given, the various components in the network 13 are assumed to have the following values.

| | | |
|---|---|---|
| Capacitor **58, 61** | micromicrofarads | 0.08 |
| Capacitor **59, 60** | do | 0.0114 |
| Inductors **62, 65** | micromicrohenries | 0.0114 |
| Inductors **63, 64** | do | 0.08 |
| Resistor **15** | ohms | 1 |

The delay characteristic curve of the network 13 is shown in Figure 3. The envelope delay relative to the delay at zero frequency versus the frequency $F_1$ is plotted. It should be noted that the network 13 need be constructed to have a substantially linear delay-frequency relation only over the band width of the modulated signal appearing at the output of the modulator 11. The modulated signal is assumed to have a carrier frequency of 6 mc. This is to be contrasted to the network 31 which must have such a relation over the range of frequencies $F_2-F_1$ or .75 to 2.75 mc. As shown in Figure 3, the delay characteristic curve of the network 13 exhibits at the frequency $F_1$, 6 mc., a slope and direction similar to the direction and slope of the delay characteristic curve of network 31 for a given frequency $F_2-F_1$. As the frequency increases over the band width of the signal appearing at the output of the modulator 11, the delay imparted by the network 13 decreases.

The modulated signal of frequency $F_1$ delayed in the manner shown in the curve of Figure 3 is applied to the mixer circuit 14. The heterodyning action performed by the mixer circuit 14 serves to reverse the order of the side bands of the resulting signal of frequency $F_2-F_1$ relative to the order of the side bands of the signal of frequency $F_1$. That is, the upper side bands of the signal of frequency $F_1$ become the lower side bands of the signal of frequency $F_2-F_1$. The lower side bands of the signal of frequency $F_1$ become the upper side bands of the signal of frequency $F_2-F_1$, and so on. As a result, a variation in the delay over the band width of the signal of frequency $F_2-F_1$ at the output of the mixer circuit 14 occurs which is substantially equal in slope but opposite in direction to the delay characteristic of the network 31. As the signal of frequency $F_2-F_1$ is fed through the network 31, the delay imparted over the band width of the signal is compensated by the delay previously imparted to the signal by the network 13.

Referring to Figure 4, the curve 70 depicts the variation in delay over the band width of the signal of frequency $F_2-F_1$ for any frequency $F_2-F_1$ appearing at the output of the mixer circuit 14. A comparison of the curve given in Figure 3 with the curve 70 of Figure 4 shows that the lower side band *a* of the signal of frequency $F_1$ has become the upper side band *a'* of the signal of frequency $F_2-F_1$. The upper side band *b* of the signal of frequency $F_1$ has become the lower side band *b'* of the signal of frequency $F_2-F_1$. As the frequency increases over the frequency band width of the signal $F_2-F_1$, the delay resulting from the operation of the network 13 increases. Curve 71 of Figure 4 depicts the delay characteristic curve of the network 31 for a frequency $F_2-F_1$ of .75 mc., and is similar to the curve given in Figure 2. Curve 72 of Figure 4 is the composite of the curves 70, 71 and depicts the resulting compensated variation in delay over the band width of the signal of .75 mc. The operation of the variable delay line for a frequency $F_2-F_1$ of .75 mc. with and without the provision of the network 13 can be seen from the following table including data taken from the curves 70, 71, 72 given in Figure 4.

*Without correction (curve 71)*

| | Microseconds delay |
|---|---|
| Upper side band | .210 |
| Carrier frequency | .1 |
| Lower side band | .01 |

*With correction (curve 72)*

| | |
|---|---|
| Upper side band | .06 |
| Carrier frequency | .07 |
| Lower side band | .09 |

Without the provision of the network 13, a variation in delay of .2 microsecond occurs over the band width of the signal of .75 mc. fed through the network 31. By providing the network 13, however, the variation in delay will only be .03 microsecond over the frequency band width of the signal. In other words, the delay over the entire frequency band width of the signal appearing at the output of the network 31 is substantially the same. A study of the operation of the invention for other frequencies $F_2-F_1$ in the range of .75 to 2.75 mc. will show that for any frequency $F_2-F_1$ the delay imparted to the signal fed through the network 31 will be substantially the same over the entire frequency band width of the signal. As the frequency $F_2-F_1$ increases, the delay imparted to the signal by the network 31 will decrease according to the curve given in Figure 2. The delay imparted to the signal is substantially the same over the entire frequency band width of the signal for each frequency $F_2-F_1$, preventing the introduction of distortions in the delayed signal due to an excessive variation in the delay over the frequency band width thereof. A variable delay line is disclosed by the invention capable of delaying a signal of relatively wide band width without distorting the signal by introducing excessive variations in the delay over the frequency band width of the signal.

In applications where the input signal is of a relatively narrow band width, the variation in the delay over the frequency band width of the signal brought about by the network 31 will in most cases be sufficiently small (.1 microsecond or less) so as to not require correction. The network 13 can be omitted, and the modulated output signal can be applied directly from the modulator 11 to the mixer circuit 14.

While particular frequencies and values of the components in the delay networks 13 and 31 have been given in describing the operation of the invention, the invention is not limited thereto. The networks 13 and 31 may be constructed to provide any delay characteristic curves desired. Instead of two filter sections, the network 31 may include any number of filter sections connected in cascade such that the composite delay characteristic curve resulting from the addition of the delay characteristic curves of the various sections has the slope and direction desired. The networks 13 and 31 can be designed to meet the requirements of a particular application. For example, the network 31 may be constructed to impart a delay which increases in amount as the frequency $F_2-F_1$ increases. In such a case, the network 13 is constructed to provide a delay over the band width of the signal appearing at the output of the mixer circuit 14 which decreases in amount as the frequency $F_2-F_1$ increases, and so on. Further, while inductance-capacitance all-pass filters have been shown, other known types of delay networks characterized by a linear delay-frequency relation may be used for the networks 13, 31. The carrier frequency $F_1$ of the signal supplied by the oscillator 12 and the range of frequencies $F_2$ supplied by the oscillator 16 are determined to meet the requirements of a particular application. While the range of frequencies $F_2$ has been described as being higher than the frequency $F_1$, the range of frequencies $F_2$ may in certain applications be lower than the frequency $F_1$. Since the frequency $F_1$ remains fixed, the position of the frequency $F_2-F_1$ on the delay characteristic curve of network 31 is determined according to the changes in the frequency $F_2$ and the operation would be similar to that described above.

A variable delay line is provided by the invention which is readily adaptable for use in a large number of applications. The networks 13, 31 can be designed according to the frequencies $F_1$, $F_2$ used such that the variable delay line imparts to an input signal a delay which varies in amount between desired limits of maximum and minimum delay, the delay imparted to the input signal being uniform over the band width of the input signal. As shown in the curve of Figure 2, the limits of the variation in delay are determined according to the range of the frequencies $F_2$ used and the slope of the delay characteristic curve of the network 31. Once the requirements as to the variation in delay in a particular application are known, the variable delay line of the invention can be readily adapted to meet those requirements.

Various modifications can be made to the arrangement of the invention shown in the drawing without departing from the spirit of the invention. While a particular variable oscillator 16 is shown, any source of a signal which varies in frequency over a predetermined range of frequencies according to a given parameter of a control signal may be used. A synchronous detector may be used in place of the amplitude detector 32 to recover the envelope of the signal fed through the variable delay line. An additional mixer stage is provided which is connected to the output of the oscillator 12 and to the output of the oscillator 16. The mixer stage produces a signal of the frequency $F_2-F_1$ (or $F_1-F_2$ if $F_1$ is higher than $F_2$) which is applied through a low pass filter to the synchronous detector. The signal supplied by the additional mixer stage, in effect, cancels the carrier of the signal applied to the synchronous detector from the network 31. The variation in the amplitude or envelope of the signal supplied from the network 31 is detected, and the resultant signal representative of the input signal to the variable delay line but delayed a desired amount is applied to the terminal 35 for application to a utilization circuit.

In the operation of the invention, the control signal applied to the terminals 26, 27 can be derived according to the operation of equipment included in a system of which the variable delay line is a part. The delayed output signal produced by the variable delay line may be applied via terminal 35 to a phase or frequency comparator to which a known reference signal is also applied. The resulting error signal is fed from the comparator to the oscillator 16 via terminals 26, 27 as the control signal. While the oscillator 16 has been described as being operated according to the amplitude of the control signal, the oscillator 16 may, of course, be arranged to operate according to a parameter of the control signal other than the amplitude thereof.

The invention is particularly adaptable for use in color television tape recording systems. In color television tape recording systems, variations in speed between the magnetic head and the tape record either while recording or reading the signal off the tape record results in undesirable frequency or phase change in the color subcarrier. The color subcarrier must conform to fairly rigid specifications as regards the actual frequency and the rate of change of frequency, and correction of the undesirable frequency and phase change is necessary. The signal read from the tape record is fed through the variable delay line of the invention and the delayed signal is compared with a known reference signal. The error signal produced is fed back to the delay line as the control signal so that the delay is changed the amount required to accomplish the necessary correction. A variable delay line is produced by the invention which is capable of delaying in a desired amount a signal of either narrow or relatively wide frequency band width. The invention is readily adaptable for use in a wide range of applications.

What is claimed is:

1. In combination, an amplitude modulator to which a first signal to be delayed and a second signal of fixed carrier frequency are applied, said modulator being responsive to said first and second signals to produce an output signal of said fixed carrier frequency amplitude modulated according to said first signal, a mixer circuit, means for applying said modulated output signal from said modulator to said mixer circuit, a source of signal energy in the form of a third signal having a frequency which is varied over a predetermined range of frequencies, means for applying said third signal from said source to said mixed circuit, said mixer circuit being responsive to said modulated output signal and said third signal to produce a resultant output signal having a carrier frequency equal to the difference between the carrier frequency of said modulated output signal and the frequency of said third signal, said resultant output signal varying over a second predetermined range of frequencies, an all-pass delay network exhibiting a non-linear phase characteristic with frequency and characterized by a linear frequency-delay relation over at least said second range of frequencies, means for applying said resultant output signal from said mixer circuit to said delay network, said delay network being responsive to said resultant output signal to impart a delay thereto in a given amount determined according to the carrier frequency of said resultant output signal, and means connected to the output of said delay network and responsive to said delayed resultant output signal to produce a signal representative of said first signal but delayed said given amount for application to a utilization circuit.

2. An electronically controlled variable delay line comprising, in combination, an amplitude modulator to which a first signal to be delayed and a second signal of fixed carrier frequency are applied, said modulator being responsive to said first and second signals to produce an output signal of said fixed carrier frequency amplitude modulated according to said first signal, a mixer circuit, means for applying said modulated output signal from said modulator to said mixer circuit, a variable oscillator arranged to produce a third signal of a frequency which varies over a predetermined range of frequencies according to a given parameter of a control signal applied to said oscillator, means for applying said third signal from said oscillator to said mixer circuit, said mixer circuit being responsive to said modulated output signal and said third signal to produce a resultant output signal having a carrier frequency equal to the difference between the carrier frequency of said modulated output signal and the frequency of said third signal, said resultant output signal varying over a second predetermined range of frequencies, an all-pass delay network exhibiting a nonlinear phase characteristic with frequency and characterized by a linear frequency-delay relation over at least said second range of frequencies, means for applying said resultant output signal from said mixer circuit to said delay network, said delay network being responsive to said resultant output signal to impart a delay thereto in a given amount determined according to the carrier frequency of said resultant output signal, and means connected to the output of said delay network and responsive to said delayed resultant output signal to produce a signal representative of said first signal but delayed said given amount for application to a utilization circuit.

3. A variable delay line comprising, in combination, an amplitude modulator to which a first signal to be delayed and a second signal of fixed carrier frequency are applied, said modulator being responsive to said first and second signals to produce an output signal of said fixed carrier frequency amplitude modulated according to said first signal, a mixer circuit, means for applying said modulated output signal from said modulator to said mixer circuit, a variable oscillator arranged to produce a third signal of a frequency which varies over a predetermined range of frequencies higher than said fixed carrier frequency according to the amplitude of a control signal applied to said oscillator, means for applying said third signal from said oscillator to said mixer circuit, said mixer circuit being responsive to said modulated output signal and said third signal to produce a resultant output signal having a carrier frequency equal to the frequency of said third signal less the carrier frequency of said modulated output signal so that said resultant output signal varies over a second predetermined range of frequencies, an all-pass delay network exhibiting a nonlinear phase characteristic with frequency and characterized by a linear delay-frequency relation at least over said second range of frequencies, means for applying said resultant output signal from said mixed circuit to said delay network, said delay network being responsive to said resultant output signal to impart a delay thereto in a given amount determined according to the carrier frequency of said resultant output signal, an amplitude detector connected to the output of said delay network for detecting the envelope of said delayed resultant output signal and for producing thereby a fourth signal representative of said first signal but delayed said given amount, a low-pass filter, an output terminal, and means for feeding said fourth signal from said detector and through said filter to said output terminal, whereby said fourth signal is available at said output terminal for application to a utilization circuit.

4. A variable delay line as claimed in claim 3 and wherein said delay network includes at least one all-pass inductor-capacitor filter section, said section being constructed such that the delay imparted to said resultant output signal by said delay network decreases in amount as the carrier frequency of said resultant output signal increases.

5. A variable delay line comprising, in combination, an amplitude modulator to which a first signal to be delayed and a second signal of fixed carrier frequency are applied, said modulator being responsive to said first and second signals to produce an output signal of said fixed carrier frequency amplitude modulated according to said first signal, a delay network connected to the output of said modulator and responsive to said modulated output signal to impart a delay to said modulated output signal which varies in amount in a predetermined manner over the frequency bandwidth of said modulated output signal, a mixer circuit, means for applying said modulated output signal from said network to said mixer circuit, a source of signal energy in the form of a third signal having a frequency which is varied over a predetermined range of frequencies, means for applying said third signal from said source to said mixer circuit, said mixer circuit being responsive to said modulated output signal and said third signal to produce a resultant output signal of said bandwidth and having a carrier frequency equal to the difference between the carrier frequency of said modulated output signal and the frequency of said third signal, the carrier frequency of said resultant output signal varying over a second predetermined range of frequencies, a second delay network connected to the output of said mixer circuit and responsive to said resultant output signal to impart a delay thereto of a given amount determined according to the carrier frequency of said resultant output signal such that a variation in the amount of delay imparted by said second network over the bandwidth of said resultant output signal is compensated by the delay previously imparted over the band width of said modulated output signal in said predetermined manner by said first network, and means connected to the output of said second network and responsive to said delayed resultant output signal to produce a signal representative of said first signal but delayed said given amount for application to a utilization circuit.

6. A variable delay line as claimed in claim 5 and wherein said first and second networks each include at least one all-pass inductor-capacitor filter section.

7. A variable delay line comprising, in combination, an amplitude modulator to which a first signal to be delayed and a second signal of fixed carrier frequency are applied, said modulator being responsive to said first and second signals to produce an output signal of said fixed carrier frequency amplitude modulated according to said first signal, a delay network connected to the output of said modulator and responsive to said modulated output signal to impart a delay to said modulated output signal which varies in amount in a predetermined manner over the frequency band width of said modulated output signal, a mixer circuit, means for applying said modulated output signal from said network to said mixer circuit, a variable oscillator arranged to supply a third signal of a frequency which is made to vary over a range of frequencies according to a given parameter of a control signal applied to said oscillator, means for applying said third signal from said oscillator to said mixer circuit, said mixer circuit being responsive to said modulated output signal and said third signal to produce a resultant output signal of said band width and having a carrier frequency equal to the difference between the carrier frequency of said modulated output signal and the frequency of said third signal, the carrier frequency of said resultant output signal varying over a second predetermined range of frequencies, a second delay network connected to the output of said mixer circuit and responsive to said resultant output signal to impart a delay thereto of a given amount determined according to the carrier frequency of said resultant output signal such that a variation in the amount of delay imparted by said second network over the band width of said resultant output signal is compensated by the delay previously imparted over the band width of said modulated output signal in said predetermined manner by said first network, and means connected to the output of said second network and responsive to said delayed resultant output signal to produce a signal representative of said first signal but delayed said given amount for application to a utilization circuit.

8. A variable delay line comprising, in combination, an amplitude modulator to which a first signal to be delayed and a second signal of fixed carrier frequency are applied, said modulator being responsive to said first and second signals to produce an output signal of said fixed carrier frequency amplitude modulated according to said first signal, a delay network connected to the output of said modulator and responsive to said modulated output signal to impart a delay to said modulated output signal which varies in amount in a predetermined manner over the frequency band width of said modulated output signal, a mixer circuit, means for applying said modulated output signal from said network to said mixer circuit, a variable oscillator arranged to supply a third signal of a frequency which varies over a range of frequencies according to a given parameter of a control signal applied to said oscillator, means for applying said third signal from said oscillator to said mixer circuit, said mixer circuit being responsive to said modulated output signal and said third signal to produce a resultant output signal of said band width and having a carrier frequency equal to the difference between the carrier frequency of said modulated output signal and the frequency of said third signal, the carrier frequency of said resultant output signal varying over a second predetermined range of frequencies, a second delay network connected to the output of said mixer circuit and responsive to said resultant output signal to impart a delay thereto of a given amount determined according to the carrier frequency of said resultant output signal, said first network being constructed according to the operation of said second network such that a variation in the amount of delay imparted by said second network over the band width of said resultant output signal is compensated by the delay imparted in said predetermined manner over the band width of said modulated output signal by said first network, and means connected to the output of said second network for detecting the envelope of said delayed resultant output signal, said last-mentioned means being arranged to produce by said detection an output signal representative of said first signal but delayed by said given amount uniformly over the band width thereof for application to a utilization circuit.

9. An electronically controlled variable delay line comprising, in combination, an amplitude modulator to which a first signal to be delayed and a second signal of fixed carrier frequency are applied, said modulator being responsive to said first and second signals to produce an output signal of said fixed carrier frequency amplitude modulated according to said first signal, a delay network connected to the output of said modulator and responsive to said modulated output signal to impart a delay to said modulated output signal which varies in amount in a predetermined manner over the band width of said modulated output signal, a mixer circuit, means for applying said modulated output signal from said network to said mixer circuit, a variable oscillator arranged to supply a third signal of a frequency which varies over a range of frequencies higher than said fixed carrier frequency according to a given parameter of a control signal applied to said oscillator, means for applying said third signal from said oscillator to said mixer circuit, said mixer circuit being responsive to said modulated output signal and to said third signal to produce a resultant output signal of said band width and having a carrier frequency equal to the frequency of said third signal less the carrier frequency of said modulated output signal, the carrier frequency of said resultant output signal varying over a second predetermined range of frequencies, a second delay network connected to the output of said mixer circuit and responsive to said resultant output signal to impart a delay thereto of a given amount determined according to the carrier frequency of said resultant output signal, said first network being constructed according to the operation of said second network such that a variation in the amount of delay imparted by said second network over the band width of said resultant output signal is compensated by the delay imparted in said predetermined manner over the band width of said modulated output signal by said first network, and means connected to the output of said second network for detecting the envelope of said delayed resultant output signal, said last-mentioned means being arranged to produce by said detection an output signal representative of said first signal but delayed by said given amount uniformly over the band width thereof for application to a utilization circuit.

10. An electronically controlled variable delay line as claimed in claim 9 and wherein said first and second networks each include at least one all-pass inductance-capacitance filter section.

11. An electronically controlled variable delay line as claimed in claim 10, and wherein said filter section included in said first network is constructed to cause said first network to impart a delay to said modulated output signal which decreases in amount as the frequency over the band width of said modulated output signal increases, whereby said resultant output signal is characterized due to the operation of said mixer circuit by a delay which increases in amount as the frequency over the band width of said resultant output signal increases, said filter section included in said second network being constructed to cause said second network to impart a delay to said resultant output signal which decreases in amount as the carrier frequency of said resultant output signal increases.

12. In combination, a mixer circuit, means for amplitude modulating a signal of fixed frequency with a second signal to be delayed and for applying the modulated output signal of said means to said mixer circuit, means for applying a third signal having a frequency variable over a range of frequencies to said mixer circuit, said mixer circuit being arranged to produce a further output signal having a carrier frequency determined by the frequency of said third signal as compared to the carrier frequency of said modulated output signal, and an all-pass delay network exhibiting a non-linear phase characteristic with frequency connected to said mixer circuit and responsive to said further output signal to produce a signal representative of said second signal but delayed by a given amount.

13. In combination, a mixer circuit, means to amplitude modulate a signal of fixed frequency with a second signal to be delayed and to apply the modulated output signal of said means to said mixer circuit, means to apply a third signal having a frequency variable over a range of frequencies to said mixer circuit, said mixer circuit being arranged to produce a further output signal having a carrier frequency equal to the difference between the carrier frequency of said modulated output signal and the frequency of said third signal, an all-pass delay circuit exhibiting a non-linear phase characteristic with frequency connected to said mixer circuit and arranged to delay said further output signal by a given amount determined by the carrier frequency of said further output signal, and means connected to said delay circuit and responsive to said further output signal delayed by said delay circuit to produce a signal representative of said second signal but delayed by said given amount.

14. An electronically controlled variable delay line comprising, in combination, an input terminal to which a signal to be delayed is applied, means connected to said terminal and arranged to amplitude modulate a second signal of fixed frequency with said first signal to produce a modulated output signal, an oscillator arranged to produce a third signal having a frequency variable over a range of frequencies different from the fixed frequency of said second signal, a mixer circuit connected to said oscillator and to said means and arranged to produce a further output signal having a carrier frequency equal to the difference between the carrier frequency of said modulated output signal and the frequency of said third signal, an all-pass delay circuit exhibiting a non-linear phase characteristic with frequency connected to said mixer circuit and arranged to delay said further output signal by an amount determined by the carrier frequency of said further output signal, and means connected to said delay circuit and responsive to said further output signal delayed by said delay circuit to produce a signal representative of said first signal but delayed said amount.

15. In combination, a delay network, means to amplitude modulate a signal of fixed frequency with a second signal to be delayed and to apply the modulated output signal of said means to said delay network, said delay network being arranged to impart a delay to said modulated output signal which varies in amount over the band width of said modulated output signal, an oscillator arranged to produce a third signal having a frequency variable over a range of frequencies different from the frequency of said first signal, a mixer circuit connected to said oscillator and to said delay network and arranged to produce a further output signal having a frequency equal to the difference between the carrier frequency of said modulated output signal and the frequency of said third signal, a second delay network connected to said mixer circuit and arranged to delay said further output signal by an amount determined by the carrier frequency of said further output signal, said first delay network being operated to produce a variation in the delay imparted over the band width of said modulated output signal to compensate for a variation in the amount of delay imparted over the band width of said further output signal by said second delay network, and means connected to said second delay network and responsive to said further output signal delayed by said second delay network to produce a signal representative of said second signal but delayed by said last-mentioned amount uniformly overs the band width thereof.

16. A variable delay line for use in a television magnetic recording system in which the picture signal has a wide range of frequencies comprising, in combination, a mixer circuit, means to amplitude modulate a second signal of fixed carrier frequency with the picture signal to be delayed and to apply the modulated output signal of said means to said mixer circuit, means to apply a third signal having a frequency variable over a range of frequencies to said mixer circuit, said mixer circuit being arranged to produce a further output signal having a carrier frequency determined by the frequency of said third signal as compared to the carrier frequency of said modulated output signal, an all-pass delay circuit exhibiting a non-linear phase characteristic with frequency connected to said mixer circuit and arranged to delay said further output signal by an amount determined by the carrier frequency of said further output signal, and means connected to said delay circuit and responsive to said further output signal delayed by said delay circuit to produce a signal representative of said picture signal but delayed by said amount.

References Cited in the file of this patent

UNITED STATES PATENTS

| | | |
|---|---|---|
| 2,472,798 | Fredendall | June 14, 1949 |
| 2,750,499 | Newman et al. | June 12, 1956 |